(12) United States Patent
Kumazaki et al.

(10) Patent No.: US 8,400,838 B2
(45) Date of Patent: Mar. 19, 2013

(54) SEMICONDUCTOR STORAGE DEVICE AND BOOSTING CIRCUIT

(75) Inventors: Noriyasu Kumazaki, Kawasaki (JP); Masafumi Uemura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 191 days.

(21) Appl. No.: 13/053,476

(22) Filed: Mar. 22, 2011

(65) Prior Publication Data
US 2011/0249492 A1    Oct. 13, 2011

(30) Foreign Application Priority Data
Apr. 9, 2010  (JP) .................................. 2010-90386

(51) Int. Cl.
*G11C 16/06* (2006.01)
(52) U.S. Cl. .......... 365/185.23; 365/185.18; 365/185.17
(58) Field of Classification Search ............. 365/185.23, 365/185.18, 185.17, 185.2; 327/536
See application file for complete search history.

(56) References Cited

U.S. PATENT DOCUMENTS
5,982,222 A      11/1999  Kyung
7,345,923 B2 *   3/2008   Kim .......................... 365/185.23

FOREIGN PATENT DOCUMENTS
JP      9-320268      12/1997

* cited by examiner

*Primary Examiner* — Huan Hoang
(74) *Attorney, Agent, or Firm* — Oblon, Spivak, McClelland, Maier & Neustadt, L.L.P.

(57) ABSTRACT

A boosting circuit includes a clock control circuit which outputs a first reference clock signal by controlling the clock signal, and which outputs a second reference clock signal having a same period as that of the first reference clock signal, the second reference clock signal shifted in phase from the first reference clock signal. The boosting circuit includes a first pump clock generation circuit which outputs the first reference clock signal which is input thereto, as a first pump clock signal in accordance with a first pump flag signal. The boosting circuit includes a second pump clock generation circuit which outputs the second reference clock signal which is input thereto, as a second pump clock signal in accordance with a second pump flag signal. The boosting circuit includes a first charge pump which boosts an input voltage in accordance with the first pump clock signal. The boosting circuit includes a second charge pump which boosts an input voltage in accordance with the second pump clock signal.

20 Claims, 21 Drawing Sheets

|  | P1/P0 | | |
| --- | --- | --- | --- |
|  | H/H | H/L | L/H,L/L |
| CLK<1> | CLK3A<br>(+0deg) | CLK2A<br>(+0deg) | CLK<br>(+0deg) |
| CLK<2> | CLK3B<br>(+90deg) | CLK2B<br>(+90deg) | CLK<br>(+0deg) |
| CLK<3> | CLK3C<br>(+45deg) | CLK2A<br>(+0deg) | CLK<br>(+0deg) |
| CLK<4> | CLK3D<br>(+135deg) | CLK2B<br>(+90deg) | CLK<br>(+0deg) |

FIG.17

SEMICONDUCTOR STORAGE DEVICE AND BOOSTING CIRCUIT

CROSS-REFERENCE TO RELATED APPLICATION

This application is based upon and claims the benefit of priority from the prior Japanese Patent Application No. 2010-90386, filed on Apr. 9, 2010, the entire contents of which are incorporated herein by reference.

BACKGROUND

1. Field

Embodiments described herein relate generally to a semiconductor storage device such as a NAND flash memory having a boosting circuit.

2. Background Art

As mobile devices such as portable telephones have spread in recent years, memories used in these mobile devices are required to have lower current dissipation.

For example, NAND flash memories are widely used in these mobile devices. It is extremely important to reduce the operation current of the NAND flash memories.

On the other hand, in "read", "write (program)" and "erase" which are basic operations of the NAND flash memories, various boosted voltages (voltages generated in the memory which are higher than the power supply voltage supplied to the memory) generated by a boosting circuit are used.

For securing the reliability, therefore, a plurality of boosting circuits which supply various voltages are needed. As a result, the current consumption of the NAND flash memory is increased.

In some conventional boosting circuits, boosting stages are caused to operate in superposition to make the output voltage high by shifting phases of enable signals.

In the conventional boosting circuits, however, dissipate currents of pumps in respective boosting stages are not studied.

BRIEF DESCRIPTION OF THE DRAWINGS

FIG. 9 is a block diagram showing an example of a conventional boosting circuit 100a;

FIG. 17 is a decode diagram showing an example of relations between a parameter which is input to the clock control circuit 11e and a phase of a reference clock signal which is output;

DETAILED DESCRIPTION

A boosting circuit according to an embodiment, supplies boosted voltages. The boosting circuit includes an oscillator configured to output a clock signal. The boosting circuit includes a clock control circuit configured to output a first reference clock signal by controlling the clock signal, and to output a second reference clock signal having a same period as that of the first reference clock signal, the second reference clock signal shifted from the first reference clock signal. The boosting circuit includes a first pump clock generation circuit configured to output the first reference clock signal, as a first pump clock signal on the basis of a first pump flag signal. The boosting circuit includes a second pump clock generation circuit configured to output the second reference clock signal, as a second pump clock signal on the basis of a second pump flag signal. The boosting circuit includes a first charge pump configured to boost an input voltage on the basis of the first pump clock signal and to output an obtained first boosted voltage to a first output terminal. The boosting circuit includes a second charge pump configured to boosts an input voltage on the basis of the second pump clock signal and to output an obtained second boosted voltage to a second output terminal.

Hereinafter, embodiments of the present invention will be described with reference to drawings.

Comparative Example

As a comparative example, a boosting operation of a Dickson type boosting circuit, and a cell configuration and a basic operation of a NAND flash memory cell will now be described to elucidate problems in the conventional technique.

First, a cell configuration of a NAND flash memory cell will be described.

Figure 1:
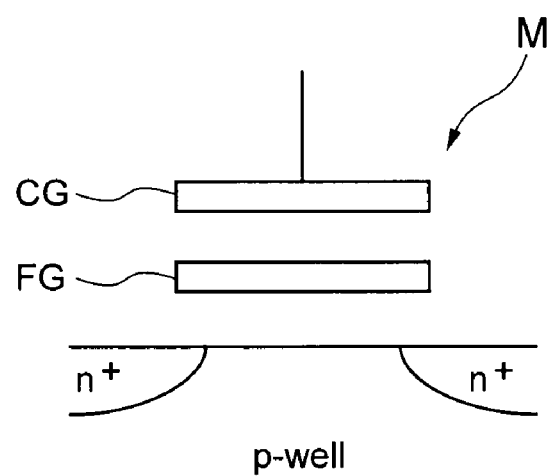
FIG. 1 is a diagram showing an example of a configuration of a memory cell transistor M of the NAND flash memory.

FIG. 1 is a diagram showing an example of a configuration of a memory cell transistor M of the NAND flash memory.

As shown in FIG. 1, one cell of the NAND flash memory is formed of a memory cell transistor M including a floating gate electrode FG and a control gate CG formed over a substrate (well) p-well.

Figure 2:
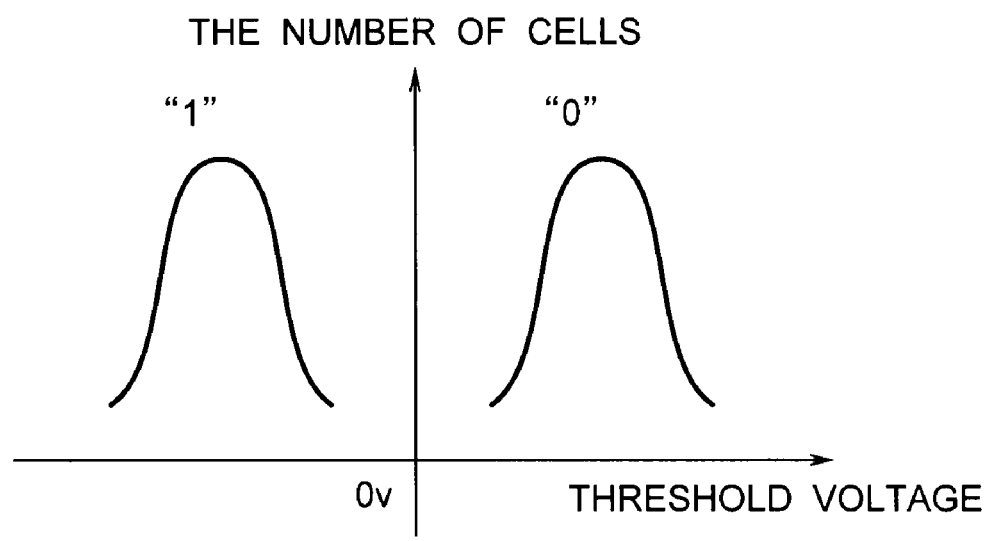
FIG. 2 is a diagram showing an example of relations between distribution of threshold voltage of the memory cell transistor M and stored data.

FIG. 2 is a diagram showing an example of relations between distribution of threshold voltage of the memory cell transistor M and stored data.

As shown in FIG. 2, the threshold voltage of the memory cell transistor M is divided into two distributions by "injecting/discharging" electrons "into/from" the floating gate electrode FG which is electrically insulated from the memory cell transistor M. In other words, data can be stored in the memory cell transistor M by assigning data "0" and data "1" to the respective distributions.

Figure 3:
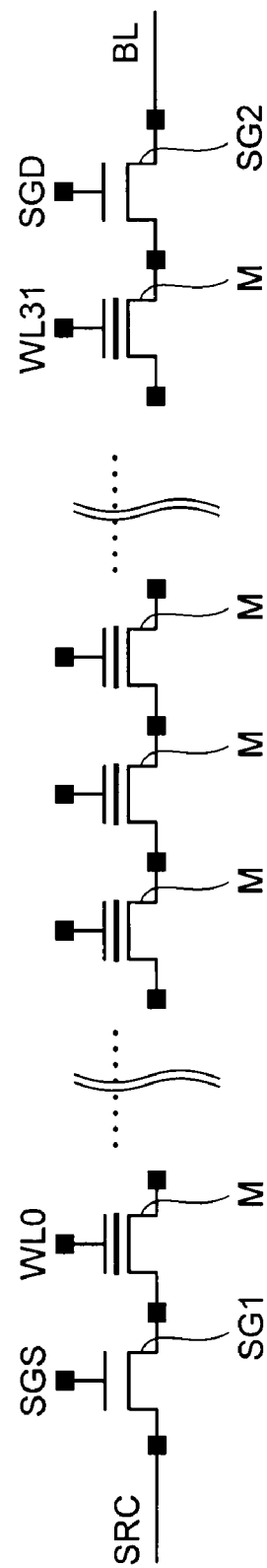
FIG. 3 is a diagram showing an example of a configuration of a NAND string in the NAND flash memory.

FIG. 3 is a diagram showing an example of a configuration of a NAND string in the NAND flash memory.

As shown in FIG. 3, word lines WL0 to WL31 are connected to control gate electrodes CG of memory cell transistors M, respectively. The NAND string is formed by connecting the memory cell transistors M in series. A selection gate transistor SG1 is connected to a memory cell transistor M disposed at an end on a source line SRC side. A selection gate transistor SG2 is connected to a memory cell transistor M disposed at an end on a bit line BL side.

Figure 4:
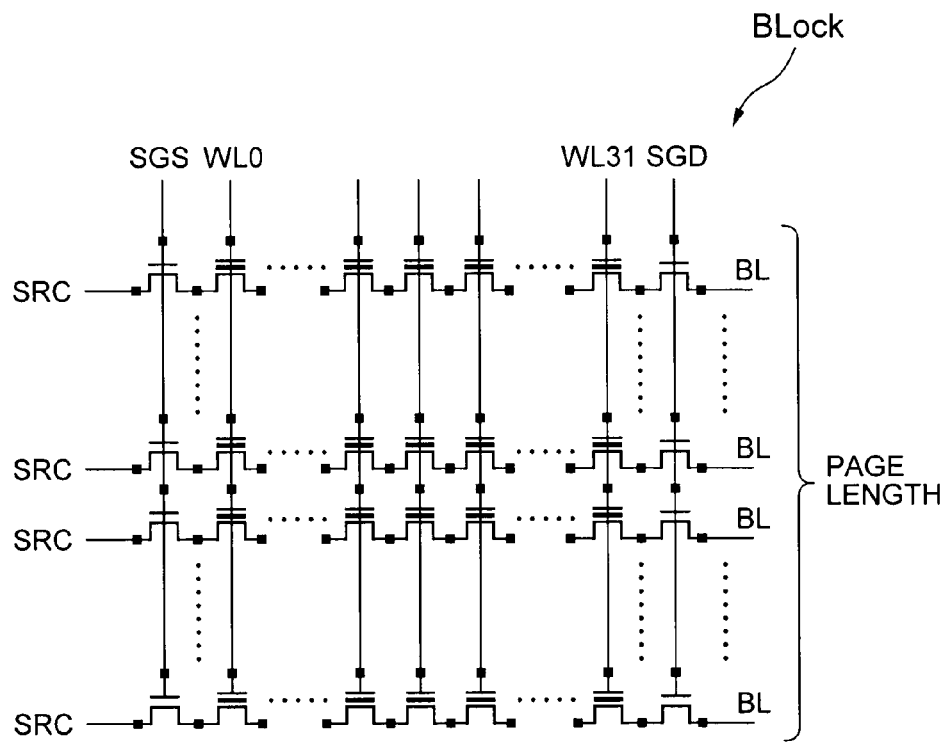
FIG. 4 is a diagram showing an example of a configuration of one block in a memory cell array of the NAND flash memory.
Figure 5:
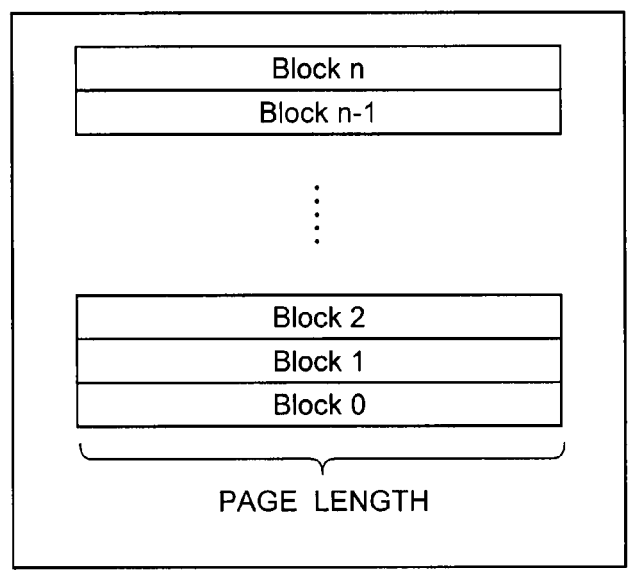
FIG. 5 is a diagram showing an example of a configuration of one plane in the NAND flash memory.

FIG. 4 is a diagram showing an example of a configuration of one block in a memory cell array of the NAND flash memory. FIG. 5 is a diagram showing an example of a configuration of one plane in the NAND flash memory.

As shown in FIG. 4, a block Block is formed by disposing a plurality of NAND strings each having selection gate transistors SG1 and SG2 respectively connected at gates to selection lines SGS and SGD on respective sides, by a page length.

Then, as shown in FIG. 5, a set of a plurality of blocks Block 0 to Block n forms one plane.

A basic operation of the NAND flash memory will now be described.

First, a read operation of the NAND flash memory will be described.

Figure 6:
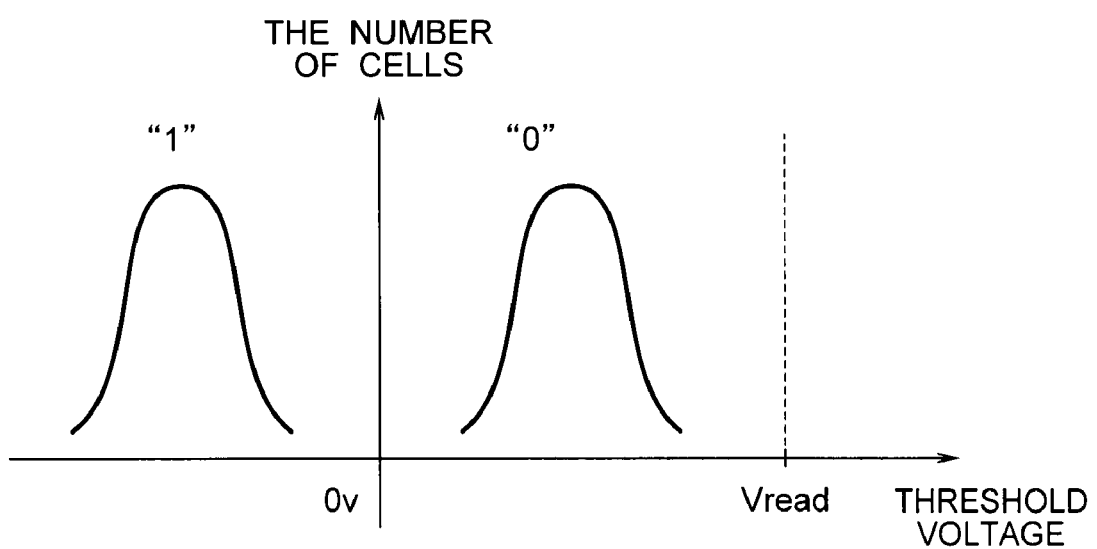
FIG. 6 is a diagram showing relations between distributions of the threshold voltage of a memory cell transistor and its voltage Vread.

FIG. 6 is a diagram showing relations between distributions of the threshold voltage of a memory cell transistor and its voltage Vread.

The memory cell transistor has two threshold distributions, as shown in FIG. 6, according to charge on the floating gate electrode FG. In other words, definition can be made to store 1-bit data in one cell by assigning data "0" and data "1" to the two distributions, respectively.

For example, data "0" is assigned to the threshold voltage distribution corresponding to a state in which electrons are injected into the floating gate electrode FG. On the other hand, data "1" is assigned to the threshold voltage distribution corresponding to a state in which electrons are emitted from the floating gate electrode FG.

As shown in FIG. 6, the voltage Vread is a voltage applied to unselected word lines at the time of reading, and it is a potential which is higher than the highest threshold distribution corresponding to the data "0". Furthermore, 0 V is located midway between the two threshold distributions.

Figure 7:
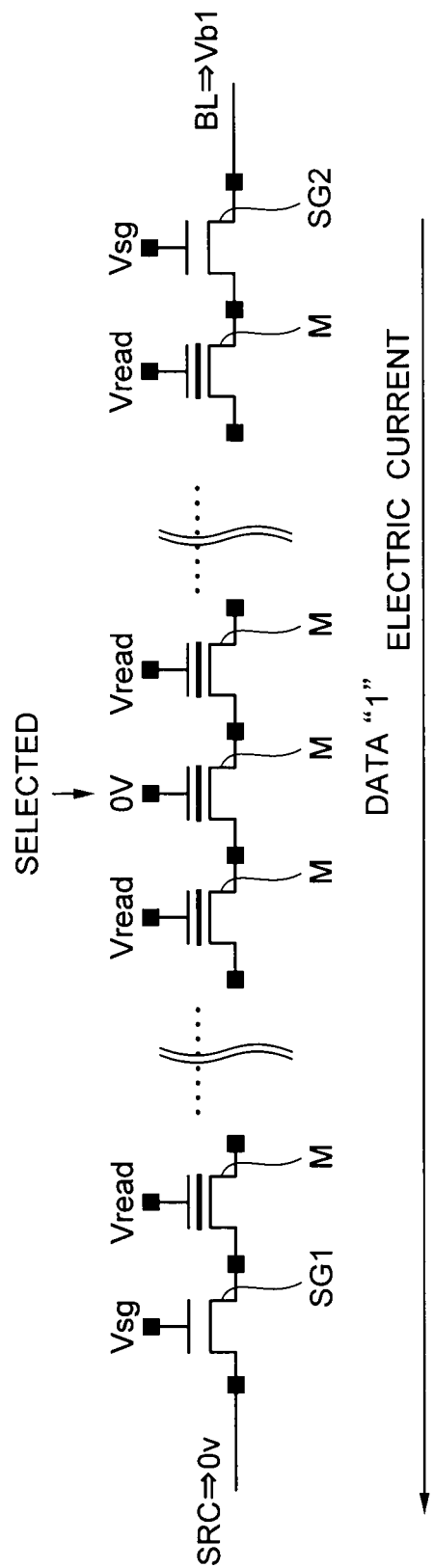
FIG. 7 is a diagram for explaining an example of a NAND string read operation in the case where the selected memory cell transistor has data "1" stored therein.
Figure 8:
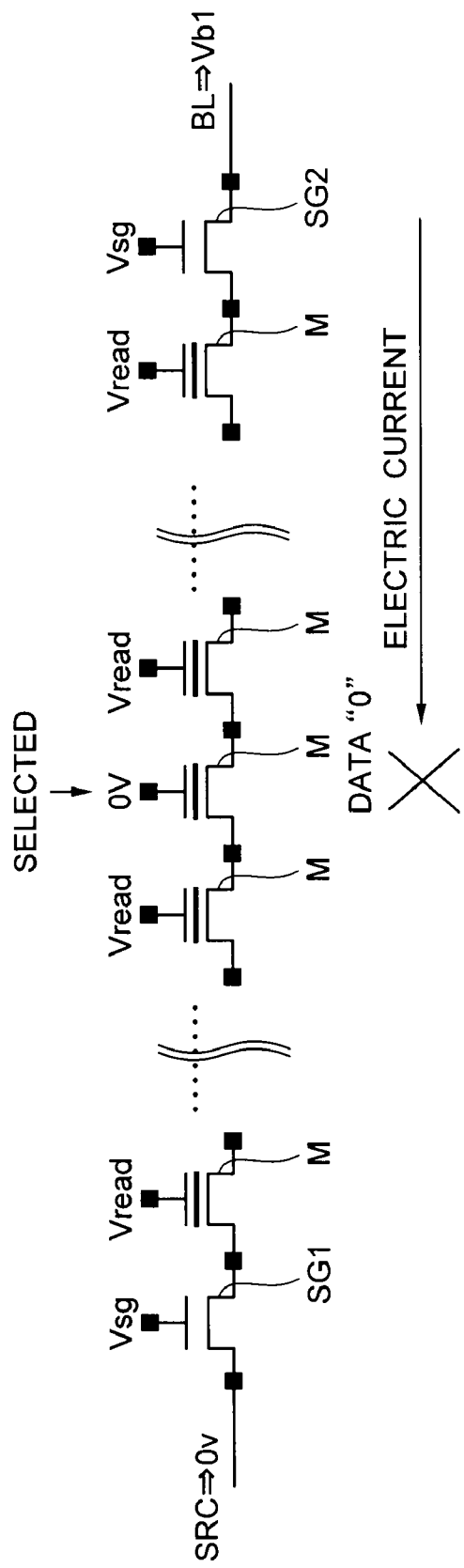
FIG. 8 is a diagram for explaining an example of a NAND string read operation in the case where the selected memory cell transistor has data "0" stored therein.

FIG. 7 is a diagram for explaining an example of a NAND string read operation in the case where the selected memory cell transistor has data "1" stored therein. FIG. 8 is a diagram for explaining an example of a NAND string read operation in the case where the selected memory cell transistor has data "0" stored therein.

For example, as shown in FIG. 7, a voltage on a word line WL of the selected memory cell transistor M from which data is to be read is set equal to 0 V, whereas a voltage on word lines WL of other unselected memory cell transistors M is set equal to the voltage Vread. Furthermore, a voltage Vb1 is applied to the bit line BL. In addition, a voltage Vsg is applied to gates of the selection gate transistors SG1 and SG2 to turn on the selection gate transistors SG1 and SG2.

Incidentally, the voltage Vsg is a voltage required for the NAND string to transfer the voltage Vb1 applied to the bit line BL.

If the threshold of the selected memory cell transistor M is 0 V or less (data "1"), then 0 V is applied to the control gate electrode (the word line WL) of the selected memory cell transistor M and consequently the selected memory cell transistor M is brought into the conduction state. In addition, the voltage Vread is applied to word lines WL of other unselected memory cell transistors M.

Therefore, no matter whether data stored in an unselected memory cell transistor M is data "0" or "1", the unselected memory cell transistor M is brought into the conduction state. As a result, a current flows through the NAND string.

On the other hand, as shown in FIG. 8, if the threshold voltage of the selected memory cell transistor M is at least 0 V (data "0"), the selected memory cell transistor M is not brought into the conduction state even when 0 V is applied to the control gate electrode (word line WL) of the selected memory cell transistor M. As a result, a current does not flow through the NAND string.

Accordingly, data "0" or data "1" stored in the selected memory cell transistor M can be read by determining whether a current "flows" or "does not flow" through the NAND string.

The operation described heretofore is a read operation which is one of basic operations of the NAND flash memory.

It is now supposed that a word line WL is charged with a voltage Vread in the read operation. The word line WL has parasitic capacitances such as a gate capacitance of memory cells, an interconnection capacitance of the word line WL, and an interconnection/diffusion layer capacitance in the peripheral circuit.

It is supposed that the total capacitance existing on the word line is Cwl and a charging level of the word line is Vread. In this case, a current Iread which is output by a pump for charging the word line WL up to the voltage Vread during a certain time T (a value determined by the performance) is represented by Equation (1).

$$I\text{read} = (C_{wl} * V\text{read})/T \tag{1}$$

In recent years, a larger capacity and a higher speed are required of the NAND flash memory. Therefore, an increase of the total capacitance Cwl and a decrease of the time T in Equation (1) advance. Therefore, the required current Iread keeps on increasing. Furthermore, since it is also considered that the level of the voltage Vread is being raised because of the cell reliability with advance of the process generation, the required current tends to increase more and more.

For improving the performance of the NAND flash memory, therefore, it is necessary to increase the current Iread. And it is necessary to increase charge pumps which are supply sources of the current Iread. The charge pumps generate internal boosted voltages from an external voltage. Therefore, an increase of the current Iread directly leads to an increase of current dissipation of the NAND flash memory.

Figure 9:
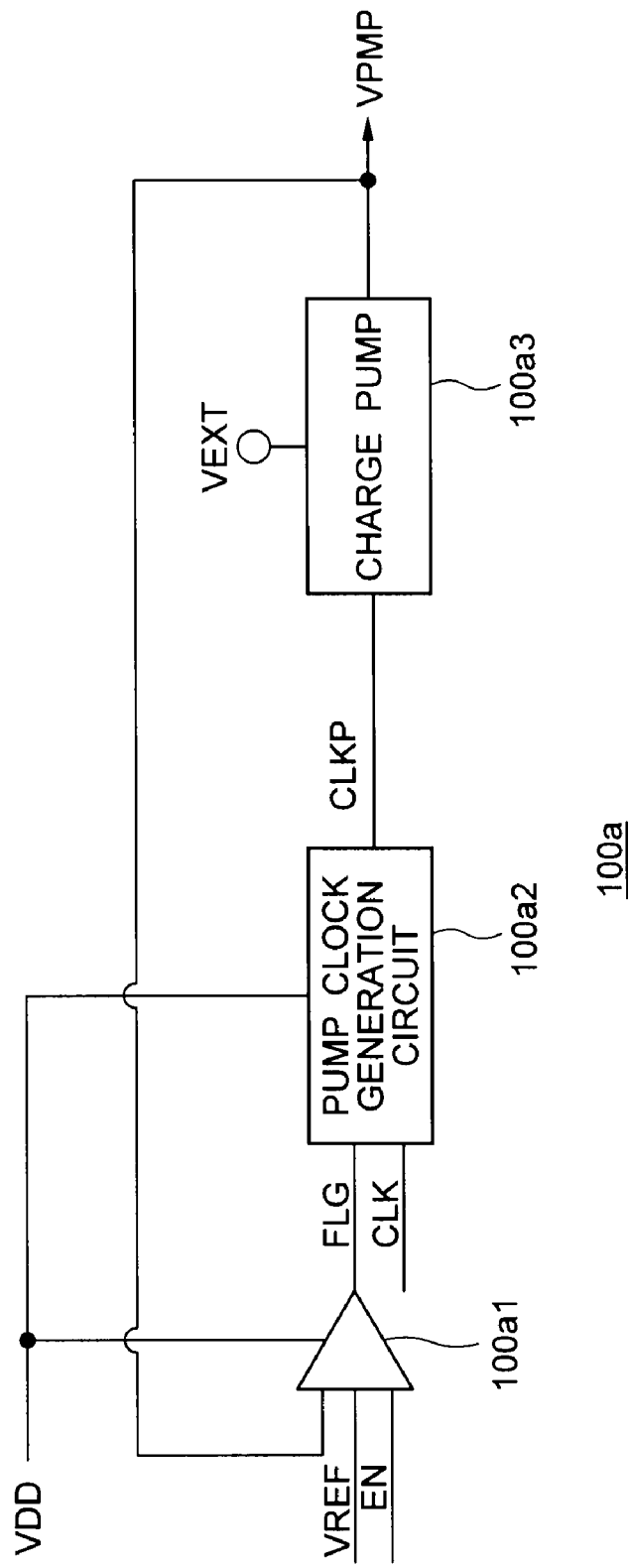

FIG. 9 is a block diagram showing an example of a conventional boosting circuit 100a.

As shown in FIG. 9, a comparator 100a1 compares a voltage obtained by applying resistance division to an output voltage VPMP with a reference voltage VREF, and outputs a flag signal FLG on the basis of a result of the comparison.

Then, a pump clock generation circuit 100a2 outputs a clock signal CLK which is input, as a pump clock signal CLKP in accordance with the flag signal FLG. And a charge pump 100a3 operates on the basis of the pump clock signal CLKP to control the output voltage VPMP of the charge pump 100a3.

First, in the boosting operation, the boosting circuit 100a starts an operation by making an enable signal EN "H."

Then, when the output voltage VPMP has not arrived at its setting level, the flag signal FLG becomes "H," and the pump clock generation circuit 100a2 is brought into operation and the charge pump 100a3 is brought into operation.

And when the output voltage VPMP has arrived at its setting level, the flag signal FLG becomes "L" and the pump clock generation circuit 100a2 stops and the charge pump 100a3 also stops. At this time, the charge pump 100a3 boosts an external voltage VEXT and outputs the output voltage VPMP.

Figure 10:
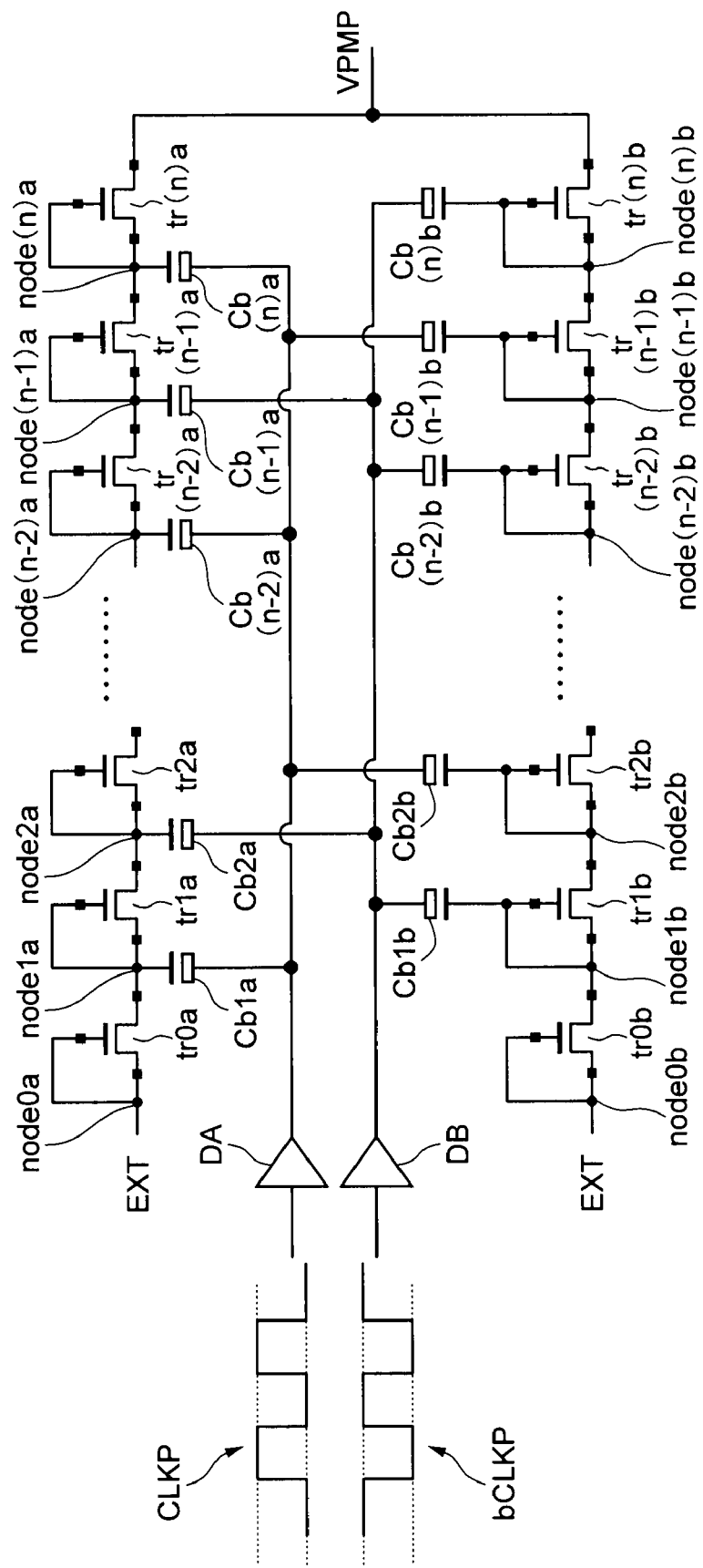
FIG. 10 is a circuit diagram showing an example of a two-phase charge pump.

FIG. 10 is a circuit diagram showing an example of a two-phase charge pump.

As shown in FIG. 10, the charge pump includes drivers DA and DB, booting capacitors Cb1a to Cb(n)a and Cb1b to Cb(n)b, and nMOS transistors tr0a to tr(n)a and tr0b to tr(n)b. The charge pump conducts a boosting operation twice during one period of pump clock signals CLKP and bCLKP. In other words, the charge pump conducts a boosting operation at both edges of a pump clock signal. Therefore, a current is dissipated at both edges of the pump clock signal CLKP.

For increasing the current Iread indicated by Equation (1) in such a boosting circuit, it is necessary to increase the number of charge pumps connected in parallel shown in FIG. 9.

Furthermore, a large number of boosting circuits are mounted for boosting power supplies of a large number of kinds in the NAND flash memory besides the voltage Vread described in the above-described typical example. The peak current increases because of simultaneous operation of these boosting circuits. Because it becomes necessary to increase the number of charge pumps in order to cope with an increase of the memory capacity/a higher speed in the same way, as to these boosting circuits as well.

In this way, the number of simultaneously operating charge pumps is increased by increasing the number of charge pumps in order to satisfy the performance of the NAND flash memory. This results in a problem of an increased peak current.

If the current peak dissipated by the NAND flash memory becomes great, noise is given to a system on which the NAND flash memory is mounted. As a result, the performance of the whole system is degraded. Therefore, reduction of the peak current becomes an extremely important problem.

It is also conceivable to prolong the time T in Equation (1) or reduce the number of charge pumps as an approach for reducing the peak current. In either case, however, there is a problem that the performance of the NAND flash memory is degraded.

Hereafter, embodiments according to the present invention, in which the above-described problem can be solved, will be described more specifically with reference to the drawings.

First Embodiment

Figure 11:
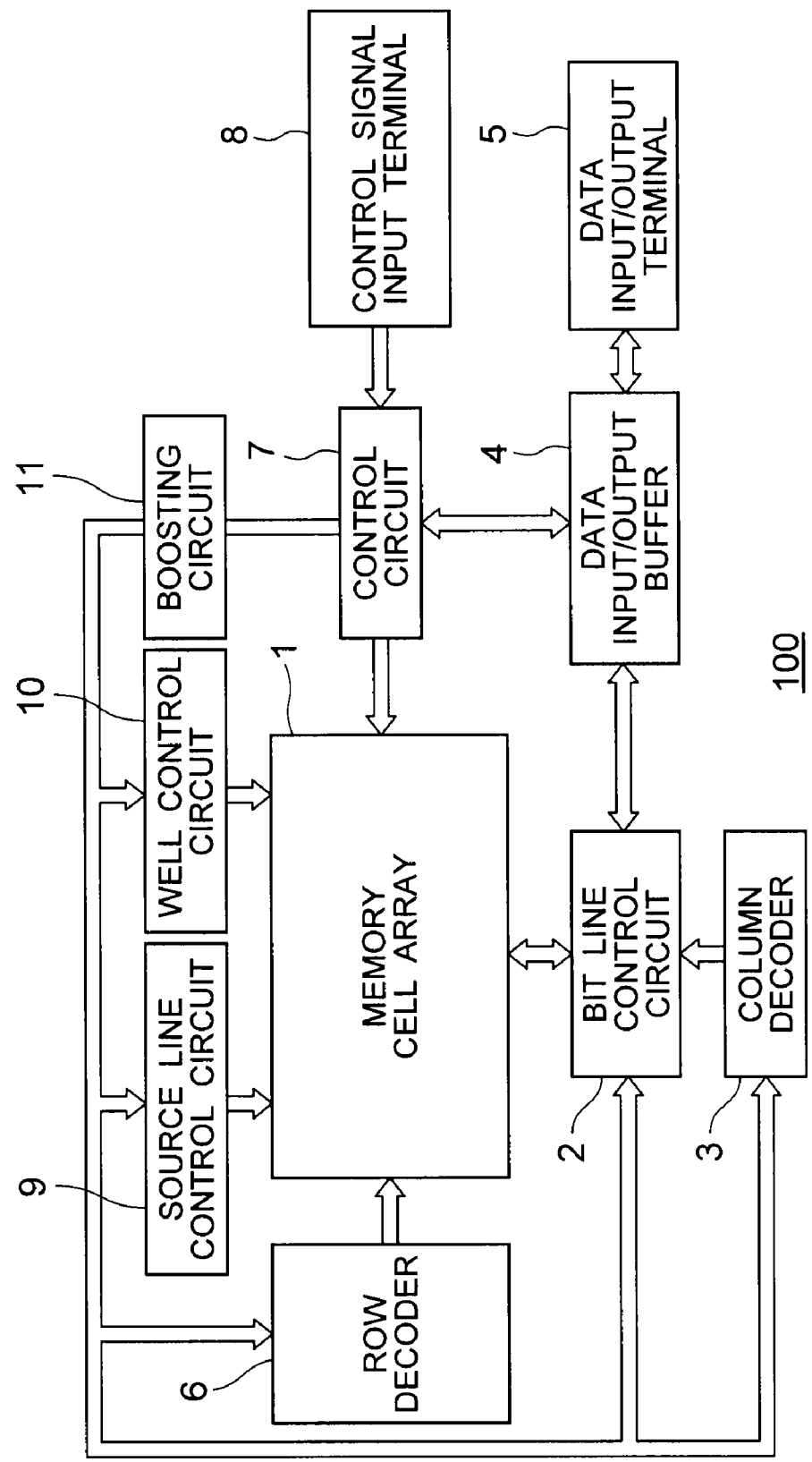
FIG. 11 is a block diagram showing an example of a configuration of a semiconductor storage device 100 according to a first embodiment.

FIG. 11 is a block diagram showing an example of a configuration of a semiconductor storage device 100 according to a first embodiment.

As shown in FIG. 11, a semiconductor storage device 100, which is a NAND flash memory, includes a memory cell array 1, a bit line control circuit 2, a column decoder 3, a data input/output buffer 4, a data input/output terminal 5, a row decoder 6, a control circuit 7, a control signal input terminal 8, a source line control circuit 9, a well control circuit 10, and a boosting circuit 11.

The memory cell array 1 includes a plurality of bit lines, a plurality of word lines, and a source line. The memory cell array 1 is formed of a plurality of blocks (not illustrated) each obtained by arranging a plurality of memory cell transistors each of which is formed of, for example, an EEPROM cell and can be electrically rewritten in data, in a matrix form.

The bit line control circuit 2 for controlling voltages on the bit lines and the row decoder 6 for controlling voltages on the word lines are connected to the memory cell array 1. At the time of a data erase operation, a certain block is selected by the row decoder 6 and remaining blocks are made unselected.

The bit line control circuit 2 includes a sense amplifier (not illustrated) which senses and amplifies a voltage on a bit line in the memory cell array 1, and a data storage circuit (not illustrated) which plays a role as a data latch circuit for latching data to be written, as well.

The bit line control circuit 2 reads data in a memory cell transistor in the memory cell array 1 via a bit line, detects a state of the memory cell transistor via a bit line, and applies a write control voltage to the memory cell transistor via a bit line to write data into the memory cell transistor.

The column decoder 3 and the data input/output buffer 4 are connected to the bit line control circuit 2. The data storage circuit in the bit line control circuit 2 is selected by the column decoder 3, and data in the memory cell transistor read into the data storage circuit is output from the data input/output terminal 5 to the outside via the data input/output buffer 4.

Write data which is input from the outside to the data input/output terminal 5 is stored in the data storage circuit selected by the column decoder 3, via the data input/output buffer 4.

The row decoder 6 is connected to the memory cell array 1. The row decoder 6 applies a voltage required to read, write or erase data to a word line connected to a control gate of a memory cell transistor in the memory cell array 1.

The source line control circuit 9 is connected to the memory cell array 1. The source line control circuit 9 is adapted to control a voltage on a source line.

The well control circuit 10 is connected to the memory cell array 1. The well control circuit 10 is adapted to control a voltage on a semiconductor substrate (well) on which a memory cell transistor is formed.

The control circuit 7 is adapted to control the memory cell array 1, the bit line control circuit 2, the column decoder 3, the data input/output buffer 4, the row decoder 6, the source line control circuit 9 and the well control circuit 10.

The control circuit 7 is adapted to control the boosting circuit 11 by using, for example, a clock signal, a control signal or the like to boost the power supply voltage (input voltage) as occasion demands, and supply the boosted voltages to the bit line control circuit 2, the column decoder 3, the data input/output buffer 4, the row decoder 6, the source line control circuit 9 and the well control circuit 10.

The control circuit 7 conducts a control operation according to a control signal (command) which is input from the outside via the control signal input terminal 8. In other words, the control circuit 7 generates predetermined voltages by using the boosting circuit 11 according to the control signal at the time of data programming, verifying, reading or erasing, and supplies the predetermined voltages to various parts in the memory cell array 1.

Figure 12:
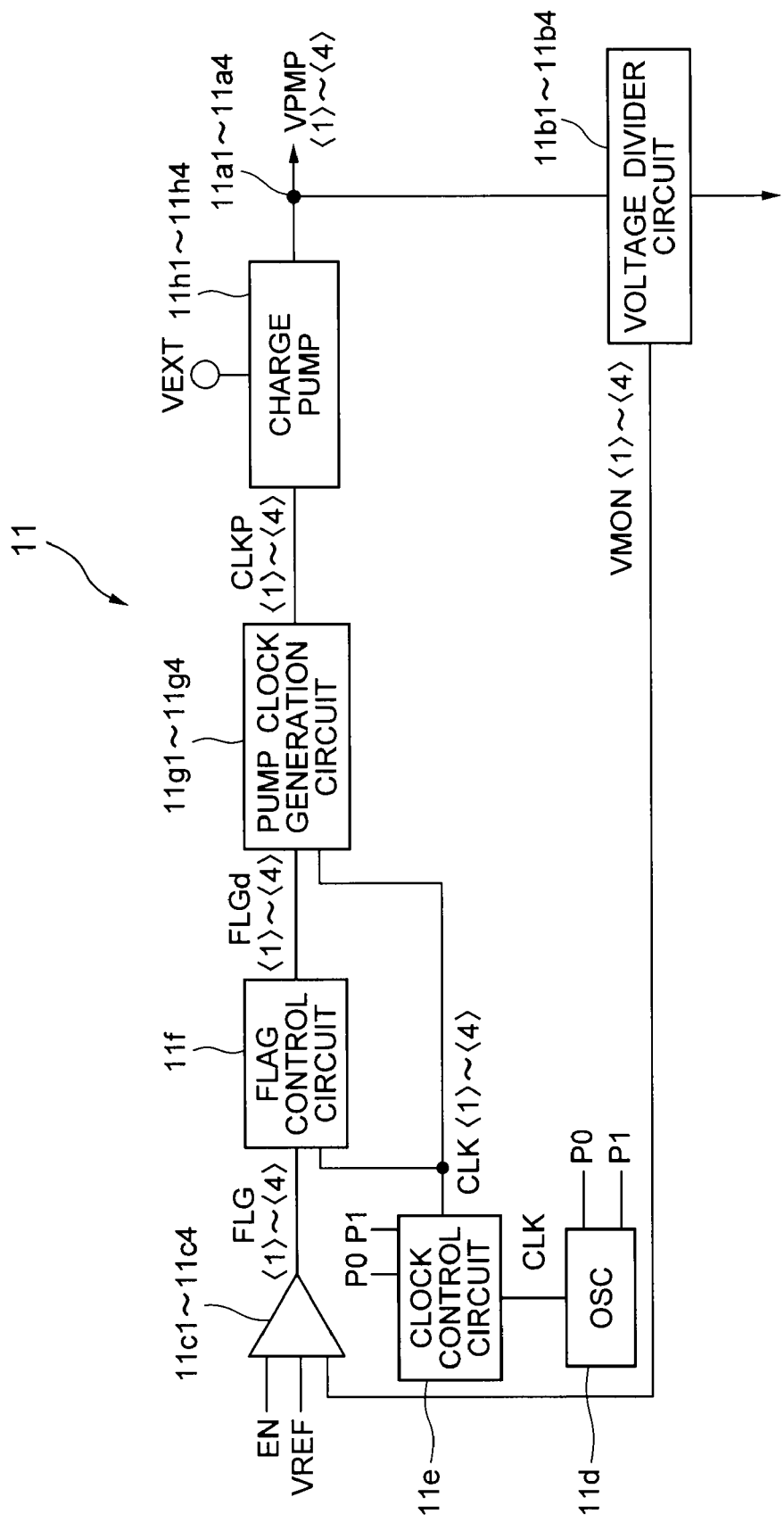
FIG. 12 is a block diagram showing an example of a circuit configuration of the boosting circuit 11 in the NAND flash memory 100 shown in FIG. 11.
Figure 13:
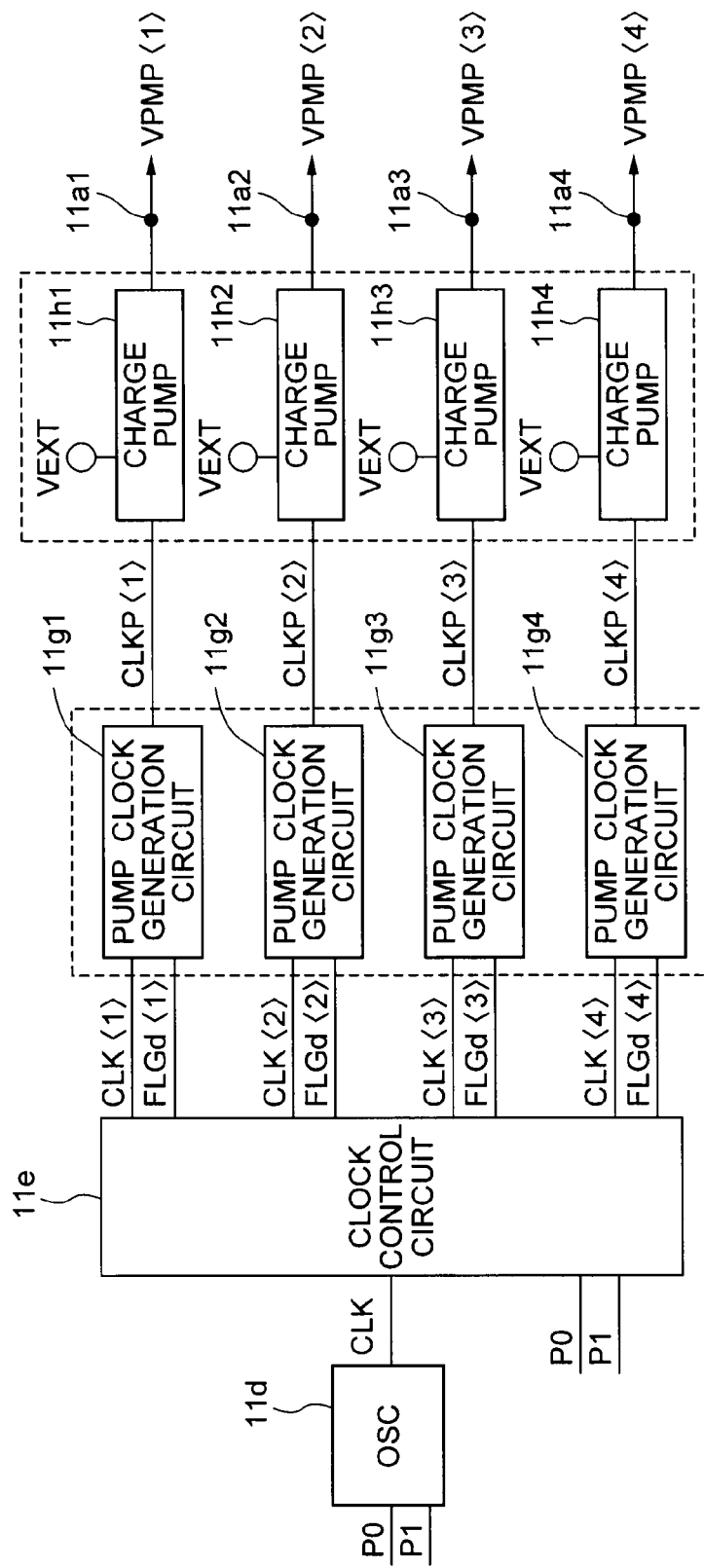
FIG. 13 is a block diagram showing an example of a configuration obtained by paying attention to an oscillator 11d, a clock control circuit 11e, a pump clock generation circuit 11g, and a charge pump 11h shown in FIG. 12.

FIG. 12 is a block diagram showing an example of a circuit configuration of the boosting circuit 11 in the NAND flash memory 100 shown in FIG. 11. FIG. 13 is a block diagram showing an example of a configuration obtained by paying attention to an oscillator 11d, a clock control circuit 11e, a pump clock generation circuit 11g, and a charge pump 11h shown in FIG. 12.

Figure 14:
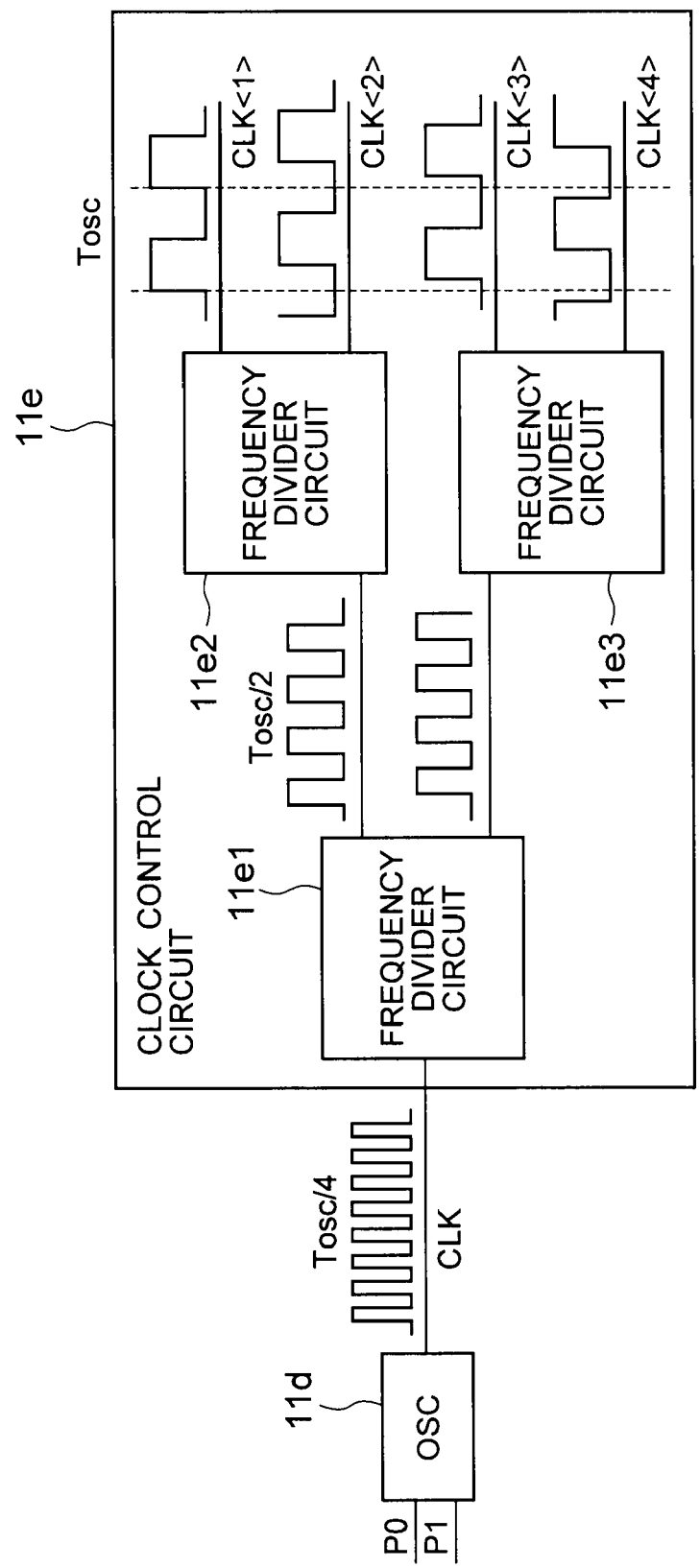
FIG. 14 is a block diagram showing an example of a configuration obtained by paying attention to the oscillator 11d and the clock control circuit 11e shown in FIG. 13.
Figure 15:
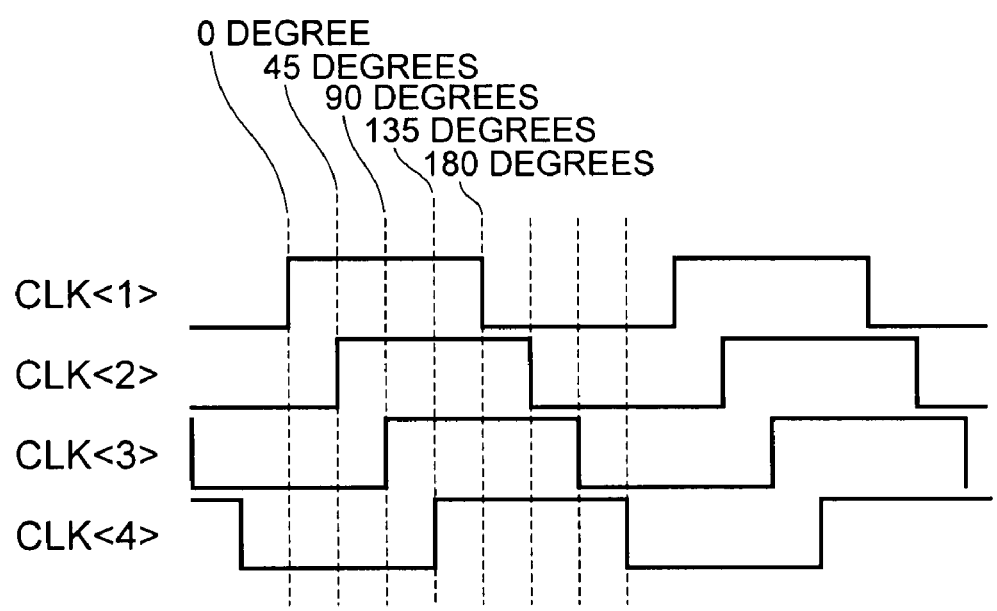
FIG. 15 is a waveform diagram showing an example of phase relations among reference clock signals CLK<1> to <4> shown in FIG. 14.

FIG. 14 is a block diagram showing an example of a configuration obtained by paying attention to the oscillator 11d and the clock control circuit 11e shown in FIG. 13. FIG. 15 is a waveform diagram showing an example of phase relations among reference clock signals CLK<1> to <4> shown in FIG. 14.

Figure 16:
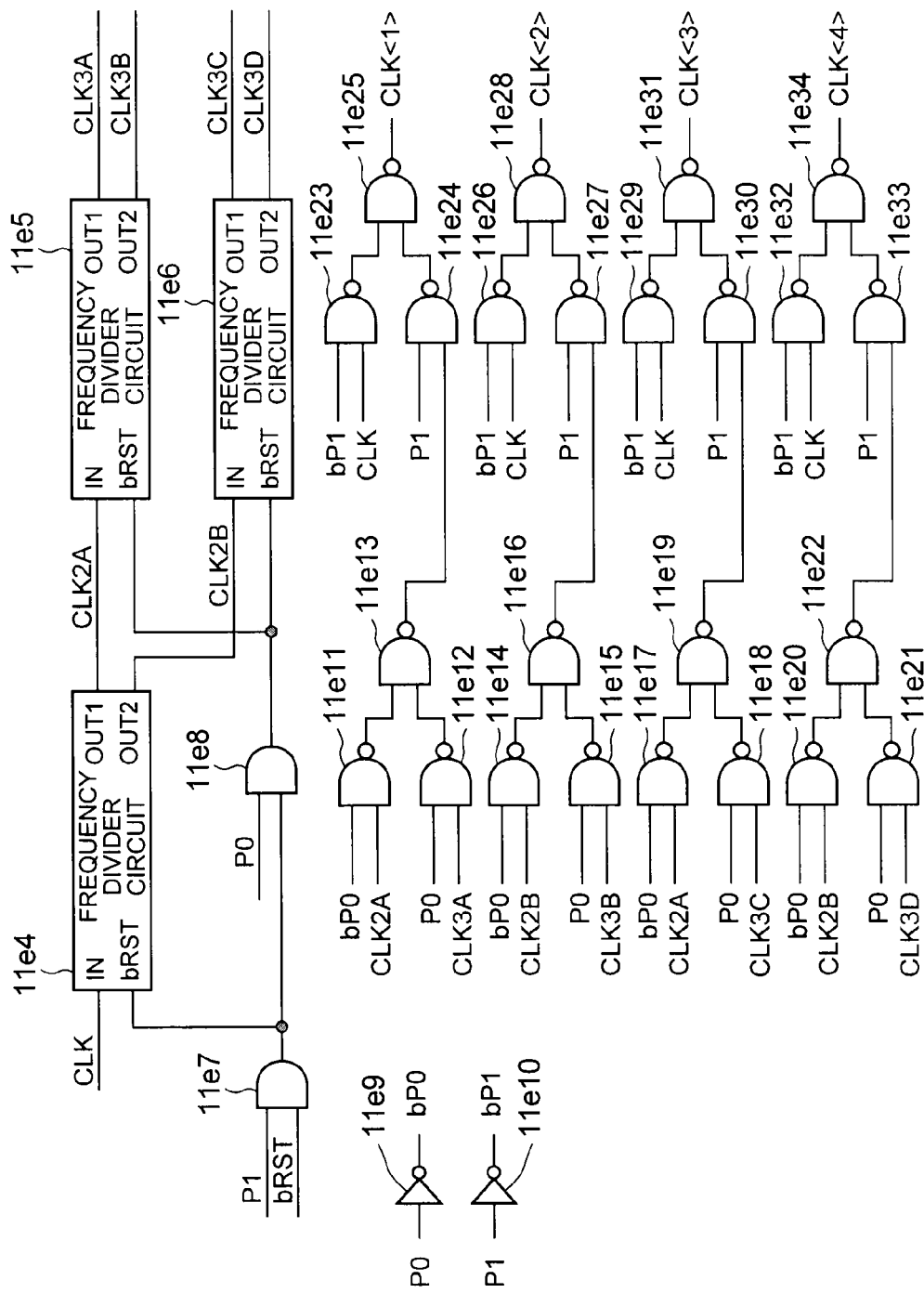
FIG. 16 is a block diagram showing another example of a concrete configuration of the clock control circuit 11e shown in FIG. 13.

FIG. 16 is a block diagram showing another example of a concrete configuration of the clock control circuit 11e shown in FIG. 13. FIG. 17 is a decode diagram showing an example of relations between a parameter which is input to the clock control circuit 11e and a phase of a reference clock signal which is output.

Figure 18:
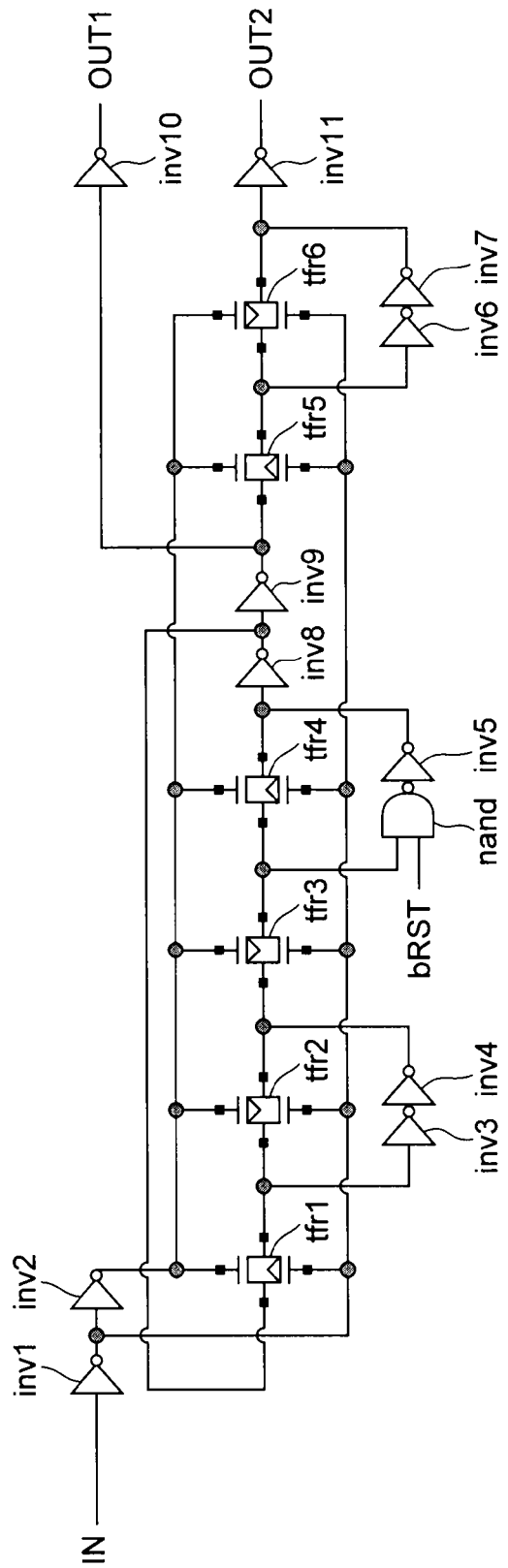
FIG. 18 is a circuit diagram showing an example of a concrete configuration of a frequency divider circuit in the clock control circuit 11e.
Figure 19:
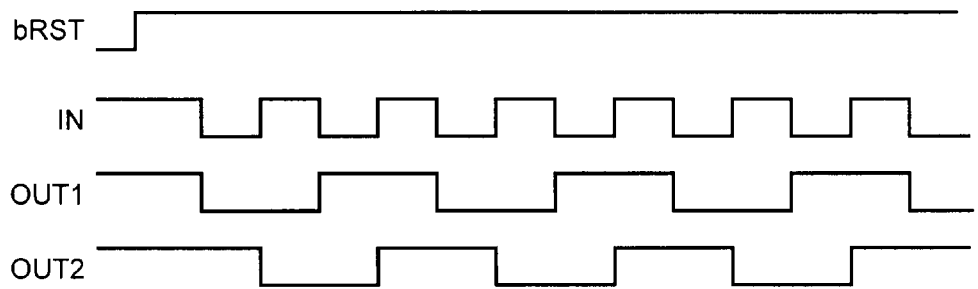
FIG. 19 is a waveform diagram showing waveforms of signals in the frequency divider circuit shown in FIG. 18.
Figure 20:
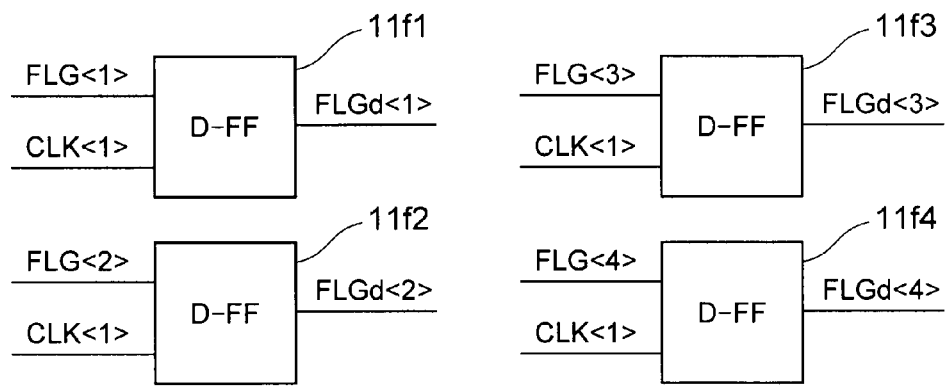
FIG. 20 is a diagram showing an example of a configuration of a flag control circuit 11f shown in FIG. 12.

FIG. 18 is a circuit diagram showing an example of a concrete configuration of a frequency divider circuit in the clock control circuit 11e. FIG. 19 is a waveform diagram showing waveforms of signals in the frequency divider circuit shown in FIG. 18. FIG. 20 is a diagram showing an example of a configuration of a flag control circuit 11f shown in FIG. 12.

The boosting circuit 11 shown in FIG. 12 is adapted to supply boosted voltages (output voltages) VPMP<1> to VPMP<4> of four kinds obtained by boosting an external voltage (input voltage) VEXT to four output terminals 11a1 to 11a4. In other words, in this example, the case where voltages of four kinds are output by four charge pumps will be described.

As shown in FIGS. 12 and 13, the boosting circuit 11 includes first to fourth output terminals 11a1 to 11a4, first to fourth voltage divider circuits 11b1 to 11b4, first to fourth comparators (flag generation circuits) 11c1 to 11c4, an oscillator 11d, a clock control circuit 11e, a flag control circuit 11f, first to fourth pump clock generation circuits 11g1 to 11g4, and first to fourth charge pumps 11h1 to 11h4.

The first voltage divider circuit 11b1 is adapted to output a first divided voltage VMON<1> obtained by conducting voltage division on a first output voltage VPMP<1> at the first output terminal 11a1.

The second voltage divider circuit 11b2 is adapted to output a second divided voltage VMON<2> obtained by conducting voltage division on a second output voltage VPMP<2> at the second output terminal 11a2.

The third voltage divider circuit 11b3 is adapted to output a third divided voltage VMON<3> obtained by conducting voltage division on a third output voltage VPMP<3> at the third output terminal 11a3.

The fourth voltage divider circuit 11b4 is adapted to output a fourth divided voltage VMON<4> obtained by conducting voltage division on a fourth output voltage VPMP<4> at the fourth output terminal 11a4.

The first comparator (flag generation circuit) 11c1 is adapted to compare the first divided voltage VMON<1> with a reference voltage VREF and output a first reference flag signal FLG<1> depending upon a result of the comparison.

The second comparator (flag generation circuit) 11c2 is adapted to compare the second divided voltage VMON<2> with the reference voltage VREF and output a second reference flag signal FLG<2> depending upon a result of the comparison.

The third comparator (flag generation circuit) 11c3 is adapted to compare the third divided voltage VMON<3> with the reference voltage VREF and output a third reference flag signal FLG<3> depending upon a result of the comparison.

The fourth comparator (flag generation circuit) 11c4 is adapted to compare the fourth divided voltage VMON<4> with the reference voltage VREF and output a fourth reference flag signal FLG<4> depending upon a result of the comparison.

For example, if the first divided voltage VMON<1> is lower than the reference voltage VREF, then the first comparator 11c1 outputs the first reference flag signal FLG<1> of a "high" level. On the other hand, if the first divided voltage VMON<1> is at least the reference voltage VREF, then the first comparator 11c1 outputs the first reference flag signal FLG<1> of a "low" level. The same is true of the second to fourth comparators 11c2 to 11c4.

The oscillator 11d is adapted to generate a clock signal CLK having a period which is set on the basis of parameters P0 and P1 stored in, for example, a ROM fuse or the like which is not illustrated and output the clock signal CLK.

The clock control circuit 11e is adapted to output a first reference clock signal CLK<1> by controlling a clock signal CLK. In addition, the clock control circuit 11e is adapted to output second to fourth reference clock signals CLK<2> to <4> which have the same period as the first reference clock signal CLK<1> and which are shifted in phase from the first reference clock signal CLK<1>, by controlling the clock signal CLK. For example, the second to fourth reference clock signals CLK<2> to <4> are shifted in phase from the first reference clock signal CLK<1> within a half of the period.

For example, as shown in FIG. 14, the clock control circuit 11e includes frequency divider circuits (first circuit) 11e1 to 11e3 which conduct frequency division on the clock signal CLK. The clock control circuit 11e generates the reference clock signals on the basis of the signals obtained by the frequency division.

It is supposed that the pump clock signals CLKP<1> to <4> respectively for the charge pumps 11h1 to 11h4 which become targets have a period Tosc. And the oscillator 11d generates the clock signal CLK having a period which is equal to a quarter of the period Tosc. The clock signal CLK is passed through the frequency divider circuits 11e1 to 11e3. As a result, the reference clock signals CLK<1> to <4> have the period Tosc which is the target period, and their edges are successively shifted in phase by 45 degrees (FIG. 15).

In other words, the clock control circuit 11e generates the reference clock signals CLK<1> to <4> on the basis of signals obtained by conducting the frequency division in the frequency divider circuits 11e1 to 11e3.

Furthermore, for example, as shown in FIG. 16, the clock control circuit 11e includes frequency divider circuits 11e4 to 11e6, AND circuits 11e7 and 11e8, inverters 11e9 and 11e10, and NAND circuits 11e11 to 11e34.

The period of the clock signal CLK which is output from the oscillator 11d changes depending upon combination of parameters P0 and P1. The reference clock signals CLK<1> to <4> (period: Tosc) shifted in phase are generated by controlling whether to pass the clock signal CLK through one frequency divider circuit, two frequency divider circuits, or no frequency divider circuits depending upon the combination of the parameters P0 and P1 (FIG. 17). Signals in the clock control circuit 11e are reset by a reset signal bRST.

If the parameters P0 and P1 are respectively "H" and "H," the oscillator lid generates the clock signal CLK having a period which is equal to a quarter of the target period (Tosc). If the parameters P0 and P1 are respectively "L" and "H," the oscillator 11d generates the clock signal CLK having a period which is equal to a half of the target period (Tosc). If the parameters P0 and P1 are respectively "H" and "L" or "L" and "L," the oscillator 11d generates the clock signal CLK having a period which is equal to the target period (Tosc).

Furthermore, for example, as shown in FIG. 18, the frequency divider circuit includes inverters inv1 to inv11, transmission gates tfr1 to tfr6, and a NAND circuit nand. As shown in FIG. 19, the frequency divider circuit shown in FIG. 18 conducts frequency division on an input signal IN, and outputs signals OUT1 and OUT2 shifted in phase from each other by a quarter of the period.

In this way, the clock control circuit 11e shifts phases of the reference clock signals for controlling various charge pumps. As a result, it becomes possible to reduce the peak current by reducing the number of charge pumps which operate simultaneously. In addition, it becomes possible to maximize the phase shift margin by using the reference clock signals obtained by the frequency division. In other words, dependence upon the process is low and it is easy to hold the phase space of 45 degrees even if the period of the clock signal varies.

As shown in FIG. 12, the flag control circuit 11f is adapted to be supplied with the first to fourth reference flag signals FLG<1> to <4> as its inputs and output the first to fourth reference flag signals FLG<1> to <4> which are input, as first to fourth pump flag signals FLGd<1> to <4> in synchronism with the first reference clock signal CLK<1>.

For example, as shown in FIG. 20, the flag control circuit 11f includes flip-flops (D-FF) 11f1 to 11f4.

The flip-flop 11f1 is adapted to be supplied with the first reference flag signal FLG<1> as its input and output a first pump flag signal FLGd<1> in synchronism with the first reference clock signal CLK<1>.

The flip-flop 11f2 is adapted to be supplied with the second reference flag signal FLG<2> as its input and output a second pump flag signal FLGd<2> in synchronism with the first reference clock signal CLK<1>.

The flip-flop 11f3 is adapted to be supplied with the third reference flag signal FLG<3> as its input and output a third pump flag signal FLGd<3> in synchronism with the first reference clock signal CLK<1>.

The flip-flop 11f4 is adapted to be supplied with the fourth reference flag signal FLG<4> as its input and output a fourth pump flag signal FLGd<4> in synchronism with the first reference clock signal CLK<1>.

For example, the flip-flop 11f1 is adapted to transfer and output a "high" level of the first reference flag signal FLG<1> which is input thereto, in synchronism with the first reference clock signal CLK<1> turning the "high" level. As a result, the reference flag signal is synchronized to the "high" edge of the clock signal shifted in phase. Other flip-flops also conduct similar operations.

The first pump clock generation circuit 11g1 is adapted to output the first reference clock signal CLK<1> which is input thereto, as the first pump clock signal CLKP<1> in accordance with the first pump flag signal FLGd<1>.

The second pump clock generation circuit 11g2 is adapted to output the second reference clock signal CLK<2> which is input thereto, as the second pump clock signal CLKP<2> in accordance with the second pump flag signal FLGd<2>.

The third pump clock generation circuit 11g3 is adapted to output the third reference clock signal CLK<3> which is input thereto, as the third pump clock signal CLKP<3> in accordance with the third pump flag signal FLGd<3>.

The fourth pump clock generation circuit 11g4 is adapted to output the fourth reference clock signal CLK<4> which is input thereto, as the fourth pump clock signal CLKP<4> in accordance with the fourth pump flag signal FLGd<4>.

Incidentally, for example, the first pump clock generation circuit 11g1 is formed of an AND circuit which is supplied with the first pump flag signal FLGd<1> and the first reference clock signal CLK<1> as its inputs and which outputs the first pump clock signal CLKP<1>. Each of other pump clock generation circuits also has a similar AND circuit.

The first charge pump 11h1 is adapted to boost the external voltage (input voltage) VEXT in accordance with the first pump clock signal CLKP<1>, and output the obtained first boosted voltage VPMP<1> to the first output terminal 11a1.

The second charge pump 11h2 is adapted to boost the external voltage (input voltage) VEXT in accordance with the second pump clock signal CLKP<2>, and output the obtained second boosted voltage VPMP<2> to the second output terminal 11a2.

The third charge pump 11h3 is adapted to boost the external voltage (input voltage) VEXT in accordance with the third pump clock signal CLKP<3>, and output the obtained third boosted voltage VPMP<3> to the third output terminal 11a3.

The fourth charge pump 11h4 is adapted to boost the external voltage (input voltage) VEXT in accordance with the fourth pump clock signal CLKP<4>, and output the obtained fourth boosted voltage VPMP<4> to the fourth output terminal 11a4.

Operation of the boosting circuit 11 according to the present first embodiment having the configuration described heretofore will now be described.

Figure 21:
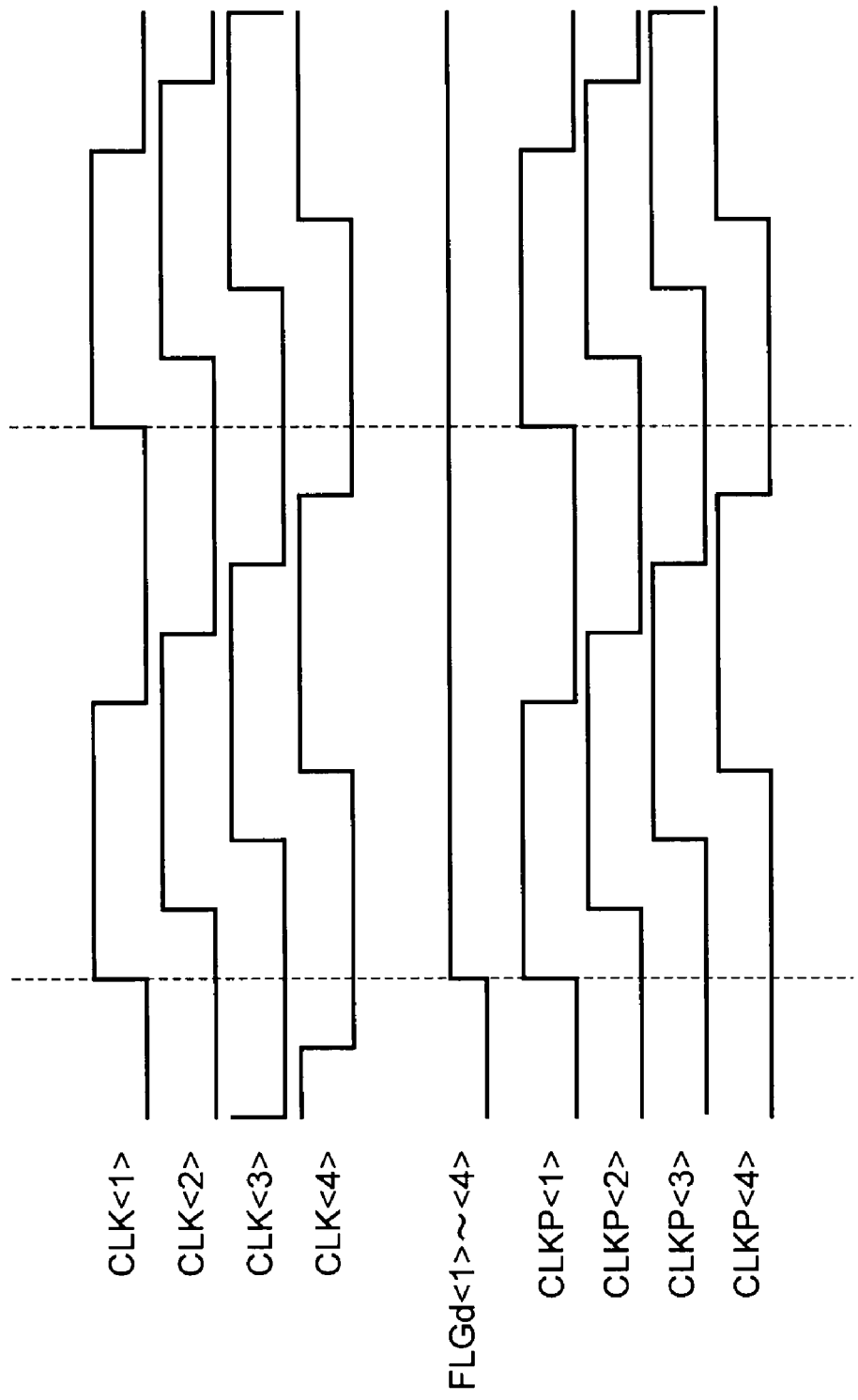
FIG. 21 is a waveform diagram showing relations among the reference clock signals CLK<1> to <4>, the pump flag signals FLGd<1> to <4>, and the pump clock signals CLKP<1> to <4> in the boosting circuit 11 according to the first embodiment.

FIG. 21 is a waveform diagram showing relations among the reference clock signals CLK<1> to <4>, the pump flag signals FLGd<1> to <4>, and the pump clock signals CLKP<1> to <4> in the boosting circuit 11 according to the first embodiment.

As shown in FIG. 21, the pump flag signals FLGd<1> to <4> which respectively gate the reference clock signals CLK<1> to <4> change to the "high" level in synchronism with a "high" level edge of the reference clock signal CLK<1> having a phase shift of 0 degree.

As a result, edges of the pump flag signals FLGd<1> to <4> which are respectively input to the charge pumps 11h1 to 11h4 are shifted without fail. In other words, the charge pumps 11h1 to 11h4 respectively supplied with the pump flag signals FLGd<1> to <4> as their inputs start the boosting operation with a time lag. In this way, the peak current can be reduced by reducing the number of charge pumps in simultaneous operation.

Since the boosting circuit 11 only controls the number of charge pumps in simultaneous operation, the output current of the boosting circuit 11 remains kept. In other words, since the average output current of the charge pumps is not decreased, it is possible to suppress the degradation of the performance.

According to the semiconductor storage device in the present embodiment, the increase of the peak current can be suppressed as described heretofore. In particular, in the NAND flash memory of which a larger capacity/a higher speed is required, the peak current can be reduced without degrading the performance. As a result, it becomes possible to reduce the noise generated by the NAND flash memory and implement a stable operation as the whole system.

The configuration according to the present first embodiment can also be applied to the case where a voltage of one kind is output by using four charge pumps. In this case, boosted voltages generated by a plurality of charge pumps may be supplied from one output terminal by using one reference flag. Specifically, in FIGS. 12 and 13, the voltage divider circuits 11*b*1 to 11*b*4 are shared and the divided voltage VMON<1> is output. In addition, the comparators 11*c*1 to 11*c*4 are shared and the reference flag signal FLG<1> is output. The flag control circuit 11*f* outputs the pump flag signals FLGd<1> to <4> on the basis of the reference flag signal FLG<1> and the reference clock signals CLK<1> to <4>.

In the description of the present first embodiment, the reference clock signal is divided into four phases. However, the embodiment can be applied in the same way even for two phases, three phases, five phases or more phases.

Second Embodiment

Figure 22:
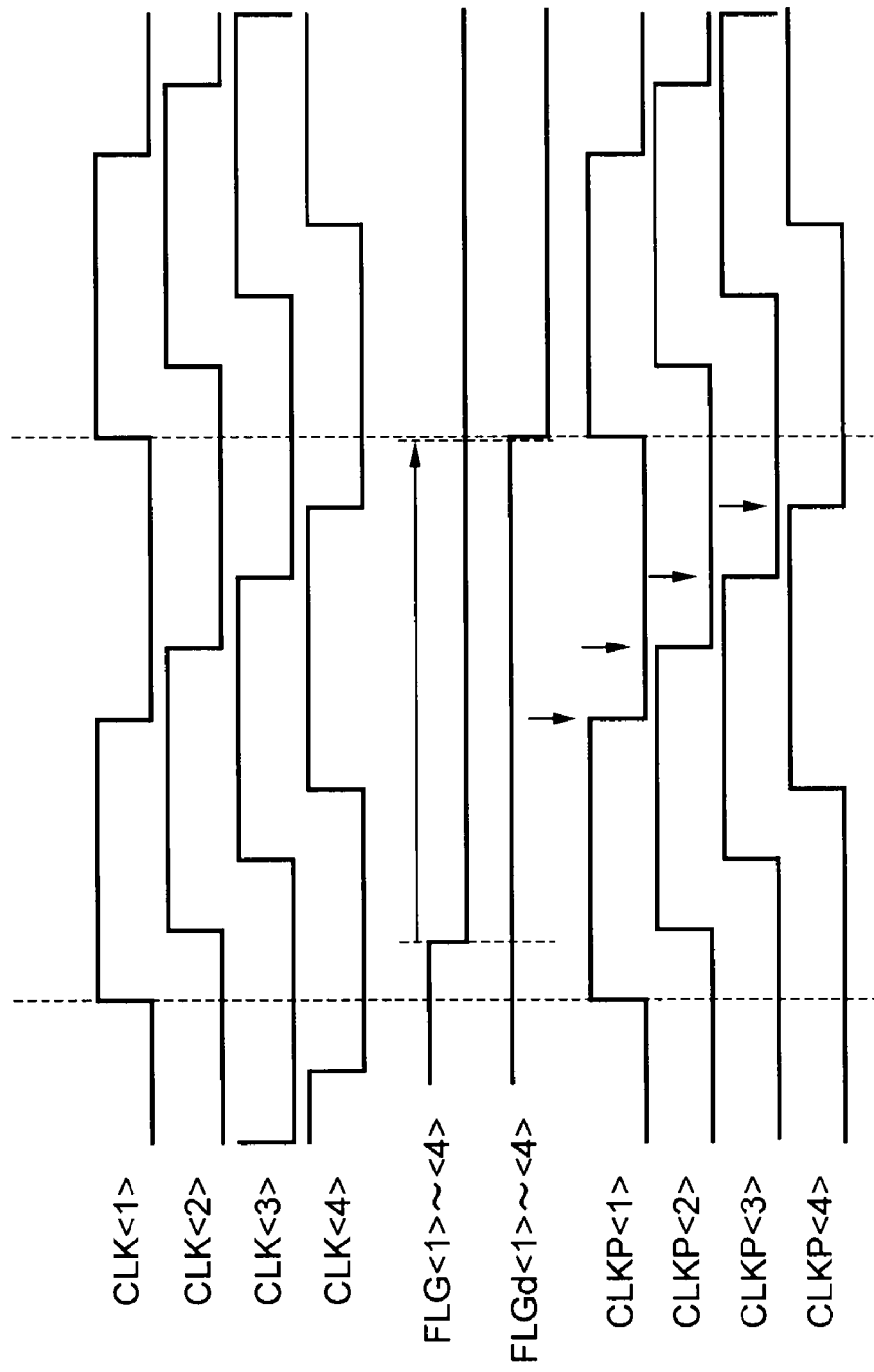
FIG. 22 is a waveform diagram showing relations among the reference clock signals CLK<1> to <4>, the pump flag signals FLGd<1> to <4>, the reference flag signals FLG<1> to <4>, and the pump clock signals CLKP<1> to <4>.

FIG. 22 is a waveform diagram showing relations among the reference clock signals CLK<1> to <4>, the pump flag signals FLGd<1> to <4>, the reference flag signals FLG<1> to <4>, and the pump clock signals CLKP<1> to <4>.

In the first embodiment already described, the pump clock signals CLKP<1> to <4> are respectively input to the charge pumps 11*h*1 to 11*h*4 during an interval in which the pump clock signals CLKP<1> to <4> are at the "high" level even if the reference flag signals FLG<1> to <4> fall. In other words, the charge pumps 11*h*1 to 11*h*4 continue the boosting operation longer than needed. As a result, the output voltage of the boosting circuit 11 might overshoot.

In the present second embodiment, therefore, a configuration of the flag control circuit 11*f* for suppressing the overshoot of the output voltage of the boosting circuit 11 will be described. Incidentally, a general configuration of the boosting circuit in the present second embodiment is similar to the configuration of the boosting circuit 11 shown in FIGS. 12 and 13.

Figure 23:
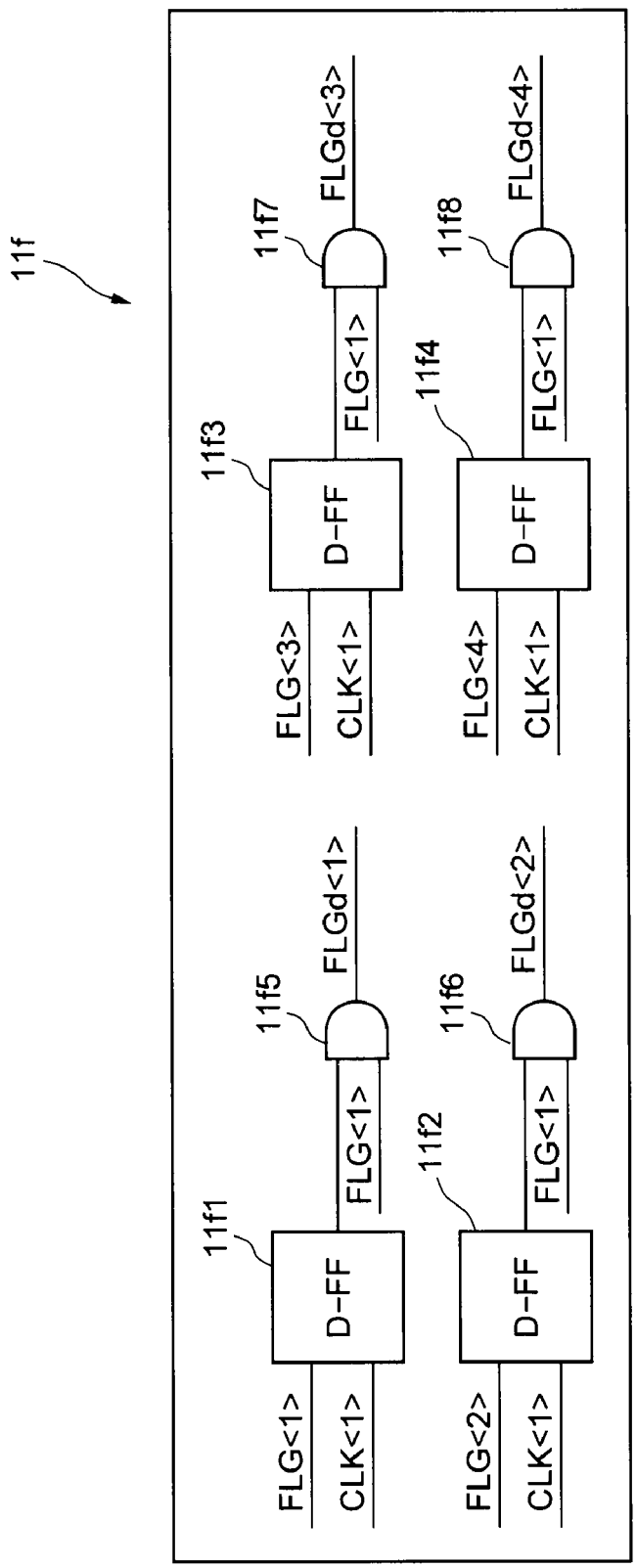
FIG. 23 is a diagram showing an example of a configuration of the flag control circuit 11f shown in FIG. 12 according to the second embodiment.

FIG. 23 is a diagram showing an example of a configuration of the flag control circuit 11*f* shown in FIG. 12 according to the second embodiment.

As shown in FIG. 23, the flag control circuit 11*f* includes flip-flops (D-FF) 11*f*1 to 11*f*4 and AND circuits 11*f*5 to 11*f*8.

The flip-flop 11*f*1 is adapted to be supplied with the first reference flag signal FLG<1> as its input and output a signal synchronized to the first reference clock signal CLK<1>.

The flip-flop 11*f*2 is adapted to be supplied with the second reference flag signal FLG<2> as its input and output a signal synchronized to the first reference clock signal CLK<1>.

The flip-flop 11*f*3 is adapted to be supplied with the third reference flag signal FLG<3> as its input and output a signal synchronized to the first reference clock signal CLK<1>.

The flip-flop 11*f*4 is adapted to be supplied with the fourth reference flag signal FLG<4> as its input and output a signal synchronized to the first reference clock signal CLK<1>.

For example, the flip-flop 11*f*1 is adapted to transfer and output a "high" level of the first reference flag signal FLG<1> which is input thereto, in synchronism with the first reference clock signal CLK<1> turning the "high" level. Other flip-flops also conduct similar operations.

An AND circuit 11*f*5 is adapted to be supplied with an output of the flip-flop 11*f*1 and the first reference flag signal FLG<1> as its inputs and output the first pump flag signal FLGd<1>.

An AND circuit 11*f*6 is adapted to be supplied with an output of the flip-flop 11*f*2 and the first reference flag signal FLG<1> as its inputs and output the second pump flag signal FLGd<2>.

An AND circuit 11*f*7 is adapted to be supplied with an output of the flip-flop 11*f*3 and the first reference flag signal FLG<1> as its inputs and output the third pump flag signal FLGd<3>.

An AND circuit 11*f*8 is adapted to be supplied with an output of the flip-flop 11*f*4 and the first reference flag signal FLG<1> as its inputs and output the fourth pump flag signal FLGd<4>.

In this way, a two-input AND circuit is added on the output side of each D-FF as compared with the first embodiment. Then, the first reference flag signal FLG<1> is input to a first input of each AND circuit and an output of the D-FF is coupled to a second input of a corresponding AND circuit.

As a result, the pump flag signals FLGd<1> to <4> fall in synchronism with falling of the first reference flag signal FLG<1>. Accordingly, the pump clock signals CLKP<1> to <4> become the "low" level and it is possible to stop the boosting operation of the charge pumps and prevent overshooting of the output voltage.

According to the semiconductor storage device in the present embodiment, the peak current can be reduced while suppressing the degradation of the performance in the same way as the first embodiment.

Third Embodiment

In the embodiments already described, the case where the clock control circuit includes frequency divider circuits which conduct frequency division on the clock signal and generates reference clock signals on the basis of a signal obtained by the frequency division has been described.

Even if delay circuits are used instead of the frequency division circuits, the reference clock signals can be generated in the same way as the first and second embodiments already described.

Figure 24:
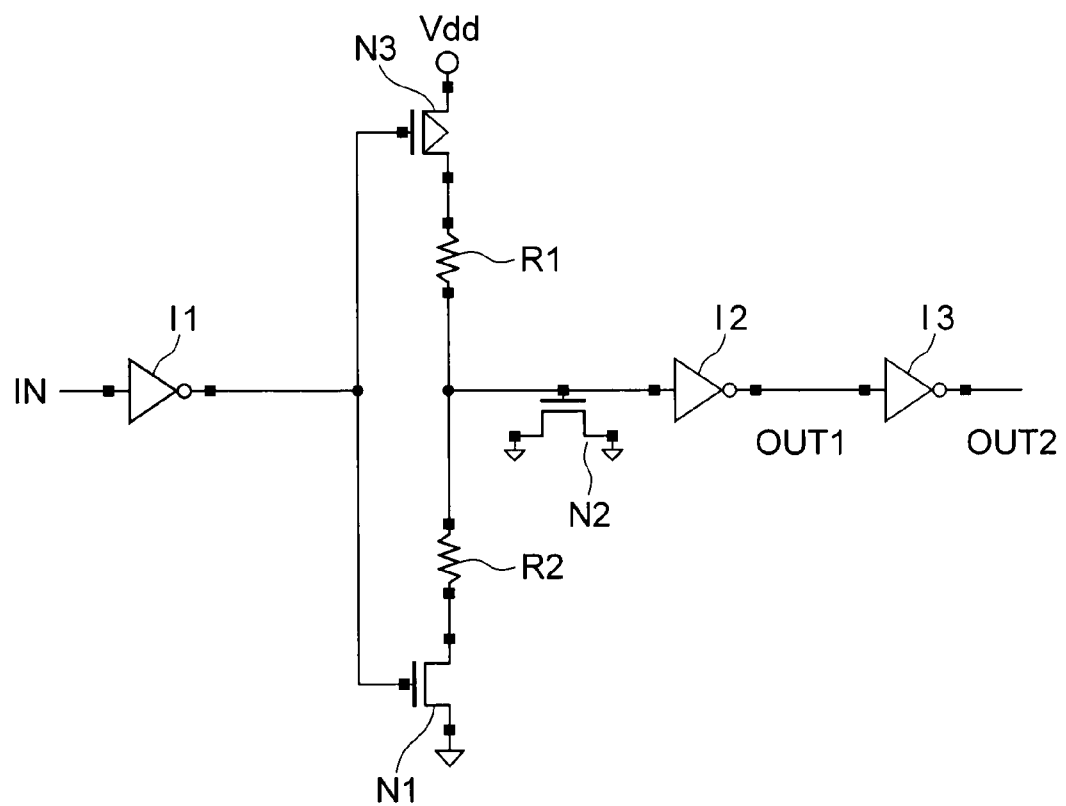
FIG. 24 is a circuit diagram showing an example of a circuit configuration of each of delay circuits applied to the clock control circuit 11e shown in FIG. 12.

In the present third embodiment, therefore, the case where delay circuits are used instead of the frequency divider circuits will be described. FIG. 24 is a circuit diagram showing an example of a circuit configuration of each of delay circuits applied to the clock control circuit 11*e* shown in FIG. 12.

As shown in FIG. 24, each of the delay circuits includes inverters I1 to I3, MOS transistors N1 and N3, and a MOS capacitor N2.

Each of the delay circuits delays an input signal (clock signal) IN, and outputs signals OUT1 and OUT2 shifted in phase from each other. The reference clock signals are generated on the basis of the delayed signals OUT1 and OUT2.

The delay circuits are applied to the clock control circuit 11*e* instead of, for example, the frequency divider circuits 11*e*1 to 11*e*3.

The peak current can be reduced in the same way as the first and second embodiments already described even if the delay circuits are used instead of the frequency divider circuits. Furthermore, the circuit can be simplified with the delay circuits as compared with the frequency divider circuits.

According to the semiconductor storage device in the present embodiment, the peak current can be reduced while suppressing the degradation of the performance in the same way as the first and second embodiments as described heretofore.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A boosting circuit which supplies boosted voltages, the boosting circuit comprising:
    an oscillator configured to output a clock signal;
    a clock control circuit configured to output a first reference clock signal by controlling the clock signal, and to output a second reference clock signal having a same period as that of the first reference clock signal, the second reference clock signal shifted from the first reference clock signal;
    a first pump clock generation circuit configured to output the first reference clock signal, as a first pump clock signal on the basis of a first pump flag signal;
    a second pump clock generation circuit configured to output the second reference clock signal, as a second pump clock signal on the basis of a second pump flag signal;
    a first charge pump configured to boost an input voltage on the basis of the first pump clock signal and to output an obtained first boosted voltage to a first output terminal; and
    a second charge pump configured to boosts an input voltage on the basis of the second pump clock signal and to output an obtained second boosted voltage to a second output terminal.

2. The boosting circuit according to claim 1, further comprising:
    a first voltage divider circuit configured to output a first voltage which divides a first output voltage at the first output terminal;
    a second voltage divider circuit configured to output a second voltage which divides a second output voltage at the second output terminal;
    a comparator which compares the first voltage with a reference voltage to output a first reference flag signal on the basis of a result of the comparison, and which compares the second voltage with a reference voltage to output a second reference flag signal on the basis of a result of the comparison; and
    a flag control circuit which is supplied with the first reference flag signal, and outputs the first reference flag signal, as the first pump flag signal in synchronism with the first reference clock signal, and which is supplied with the second reference flag signal, and outputs the second reference flag signal, as the second pump flag signal in synchronism with the first reference clock signal.

3. The boosting circuit according to claim 1, wherein the second reference clock signal is shifted from the first reference clock signal within a half of the period.

4. The boosting circuit according to claim 2, wherein the second reference clock signal is shifted from the first reference clock signal within a half of the period.

5. The boosting circuit according to claim 1, wherein the clock control circuit comprises a first circuit which divides frequency of the clock signal, and generates the first and second reference clock signals on the basis of signals divided by the first circuit.

6. The boosting circuit according to claim 2, wherein the clock control circuit comprises a first circuit which divides frequency of the clock signal, and generates the first and second reference clock signals on the basis of signals divided by the first circuit.

7. The boosting circuit according to claim 3, wherein the clock control circuit comprises a first circuit which divides frequency of the clock signal, and generates the first and second reference clock signals on the basis of signals divided by the first circuit.

8. The boosting circuit according to claim 4, wherein the clock control circuit comprises a first circuit which divides frequency of the clock signal, and generates the first and second reference clock signals on the basis of signals divided by the first circuit.

9. A boosting circuit which supplies boosted voltages, the boosting circuit comprising:
    an oscillator configured to output a clock signal;
    a clock control circuit configured to output a first reference clock signal by controlling the clock signal, and to output a second reference clock signal having a same period as that of the first reference clock signal, the second reference clock signal shifted from the first reference clock signal;
    a first pump clock generation circuit configured to output the first reference clock signal, as a first pump clock signal on the basis of a first pump flag signal;
    a second pump clock generation circuit configured to output the second reference clock signal, as a second pump clock signal on the basis of the first pump flag signal;
    a first charge pump configured to boost an input voltage on the basis of the first pump clock signal and to output an obtained first boosted voltage to a first output terminal; and
    a second charge pump configured to boosts an input voltage on the basis of the second pump clock signal and to output an obtained second boosted voltage to the first output terminal.

10. The boosting circuit according to claim 9, further comprising:
    a first voltage divider circuit configured to output a first voltage which divides a first output voltage at the first output terminal;
    a comparator which compares the first voltage with a reference voltage to output a first reference flag signal on the basis of a result of the comparison; and
    a flag control circuit which is supplied with the first reference flag signal, and outputs the first reference flag signal, as the first pump flag signal in synchronism with the first reference clock signal.

11. The boosting circuit according to claim 9, wherein the second reference clock signal is shifted from the first reference clock signal within a half of the period.

12. The boosting circuit according to claim 10, wherein the second reference clock signal is shifted from the first reference clock signal within a half of the period.

13. The boosting circuit according to claim 9, wherein the clock control circuit comprises a first circuit which divides frequency of the clock signal, and generates the first and second reference clock signals on the basis of signals divided by the first circuit.

14. The boosting circuit according to claim 10, wherein the clock control circuit comprises a first circuit which divides frequency of the clock signal, and generates the first and second reference clock signals on the basis of signals divided by the first circuit.

15. The boosting circuit according to claim 11, wherein the clock control circuit comprises a first circuit which divides frequency of the clock signal, and generates the first and second reference clock signals on the basis of signals divided by the first circuit.

16. The boosting circuit according to claim 12, wherein the clock control circuit comprises a first circuit which divides frequency of the clock signal, and generates the first and second reference clock signals on the basis of signals divided by the first circuit.

17. A semiconductor storage device comprising:
a memory cell array included a plurality of memory cell transistors;
a row decoder configured to apply a voltage required to word lines connected to a control gate of each of the memory cell transistors;
a boosting circuit configured to supply boosted voltages boosted an input voltage to the row decoder,
wherein the boosting circuit comprising:
an oscillator configured to output a clock signal;
a clock control circuit configured to output a first reference clock signal by controlling the clock signal, and to output a second reference clock signal having a same period as that of the first reference clock signal, the second reference clock signal shifted from the first reference clock signal;
a first pump clock generation circuit configured to output the first reference clock signal, as a first pump clock signal on the basis of a first pump flag signal;
a second pump clock generation circuit configured to output the second reference clock signal, as a second pump clock signal on the basis of a second pump flag signal;
a first charge pump configured to boost an input voltage on the basis of the first pump clock signal and to output an obtained first boosted voltage to a first output terminal; and
a second charge pump configured to boosts an input voltage on the basis of the second pump clock signal and to output an obtained second boosted voltage to a second output terminal.

18. The semiconductor storage device according to claim 17, wherein the boosting circuit further comprising:
a first voltage divider circuit configured to output a first voltage which divides a first output voltage at the first output terminal;
a second voltage divider circuit configured to output a second voltage which divides a second output voltage at the second output terminal;
a comparator which compares the first voltage with a reference voltage to output a first reference flag signal on the basis of a result of the comparison, and which compares the second voltage with a reference voltage to output a second reference flag signal on the basis of a result of the comparison; and
a flag control circuit which is supplied with the first reference flag signal, and outputs the first reference flag signal, as the first pump flag signal in synchronism with the first reference clock signal, and which is supplied with the second reference flag signal, and outputs the second reference flag signal, as the second pump flag signal in synchronism with the first reference clock signal.

19. The semiconductor storage device according to claim 17, wherein the semiconductor storage device is a NAND flash memory.

20. The semiconductor storage device according to claim 18, wherein the semiconductor storage device is a NAND flash memory.

* * * * *